US008667671B2

(12) United States Patent
Kim

(10) Patent No.: US 8,667,671 B2
(45) Date of Patent: Mar. 11, 2014

(54) VACUUM NOZZLE CONTROL APPARATUS

(75) Inventor: Byung-Ju Kim, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 804 days.

(21) Appl. No.: 12/760,691

(22) Filed: Apr. 15, 2010

(65) Prior Publication Data

US 2010/0263157 A1   Oct. 21, 2010

(30) Foreign Application Priority Data

Apr. 15, 2009   (KR) .................. 10-2009-0032835

(51) Int. Cl.
B23P 19/00   (2006.01)
(52) U.S. Cl.
USPC .................. 29/743; 29/740; 29/741; 29/720
(58) Field of Classification Search
USPC ........... 29/740–743, 720–721, 705; 294/64.1; 414/627, 752.1
See application file for complete search history.

(56) References Cited

U.S. PATENT DOCUMENTS

| | | | | |
|---|---|---|---|---|
| 3,648,740 A | * | 3/1972 | Pruitt | 141/8 |
| 3,834,118 A | * | 9/1974 | Waldrop et al. | 53/79 |
| 4,473,247 A | * | 9/1984 | Itemadani et al. | 294/2 |
| 5,314,223 A | * | 5/1994 | Harper et al. | 294/185 |
| 5,533,253 A | * | 7/1996 | Mifuji | 29/741 |
| 6,153,887 A | * | 11/2000 | Furuta | 250/559.4 |
| 6,519,838 B1 | * | 2/2003 | Okuda et al. | 29/740 |
| 6,851,914 B2 | * | 2/2005 | Hirata | 414/627 |
| 2009/0065149 A1 | * | 3/2009 | Yamasaki | 156/353 |

FOREIGN PATENT DOCUMENTS

| | | |
|---|---|---|
| CN | 2052468 U | 2/1990 |
| CN | 1345177 A | 4/2002 |
| JP | 09-223898 A | 8/1997 |
| JP | 11-040989 A | 2/1999 |
| KR | 97-50336 A | 8/1997 |
| KR | 10-0128452 B1 | 11/1997 |
| KR | 10-2001-0097134 A | 11/2001 |
| KR | 10-2003-0046306 A | 6/2003 |

OTHER PUBLICATIONS

Communication dated Nov. 2, 2011 issued in counterpart Chinese Patent Application No. 201010161939.8.

* cited by examiner

*Primary Examiner* — Minh Trinh
(74) *Attorney, Agent, or Firm* — Sughrue Mion, PLLC

(57)   ABSTRACT

A vacuum nozzle control apparatus includes a nozzle module having a vacuum hole, a vacuum providing module configured to provide a vacuum to the vacuum hole through a vacuum line, and a vacuum control module configured to selectively form the vacuum in the vacuum hole through the vacuum line, or release the vacuum formed in the vacuum hole through a release line branched off from the vacuum line to expose the vacuum hole to air.

7 Claims, 6 Drawing Sheets

VACUUM NOZZLE CONTROL APPARATUS

CROSS-REFERENCE TO RELATED PATENT APPLICATION

This application claims priority from Korean Patent Application No. 10-2009-0032835, filed on Apr. 15, 2009, the disclosure of which is incorporated herein in its entirety by reference.

BACKGROUND

1. Field

Apparatuses consistent with the present inventive concept relate to a vacuum nozzle control apparatus and a head assembly for a chip mounter having the same that are capable of readily controlling formation of a vacuum in a nozzle using a single valve to suction or mount an electronic part to prevent a phenomenon such as overshoot due to a vacuum release pressure generated when the vacuum is released.

2. Description of Related Art

In general, a chip mounter is an apparatus for mounting semiconductor chips manufactured through a semiconductor manufacturing process on a printed circuit board (PCB).

Electronic parts such as semiconductor chips are sequentially supplied into the chip mounter through a part supply apparatus such as a tape feeder. A head nozzle assembly installed at the chip mounter sequentially picks up the electronic parts supplied as described above to convey them to mounting positions on the PCB.

The head nozzle assembly is conveyed to a pick-up position and a mounting position of an electronic part by a conveyance module which is also installed at the chip mounter.

The head nozzle assembly can receive a vacuum pressure and suction the electronic part disposed at the pick-up position using a pneumatic pressure system, and release the provided vacuum pressure to mount the electronic part on the PCB at the mounting position.

Constitution of the head nozzle assembly using the pneumatic pressure system will be described.

FIG. 1 illustrates the above-described head nozzle assembly which includes a nozzle 90 having a vacuum hole 91, a vacuum provider 80 configured to provide a vacuum in the vacuum hole 91, a vacuum line 71 configured to connect the vacuum provider 80 to the vacuum hole 91, a release line 72 configured to expose the vacuum hole 91 to the air, a first valve 60 installed at the vacuum line 71, and a second valve 62 installed at the release line 72.

According to the above constitution, when an electronic part is suctioned using the nozzle 90, the first valve 60 is opened, and thus, the vacuum provider 80 can provide a vacuum in the vacuum hole 91. At this time, the second valve 62 is in a closed state.

In addition, when the electronic part is mounted on the PCB, the first valve 60 is closed and the second valve 62 is opened. Therefore, the vacuum formed in the vacuum hole 91 is exposed to the air through the release line 72 to form an atmosphere pressure state in the vacuum hole. As a result, the electronic part can be separated from the vacuum hole 91 of the nozzle 90 to be seated and mounted on the PCB.

However, according to the above constitution, in order to repeatedly form and release the vacuum in the vacuum hole 91, a plurality of first and second valves 60 and 62 controlled by a controller 81 are needed. Therefore, since the valves 60 and 62 are individually controlled during a process of repeatedly suctioning and mounting the electronic part, their control process is complicated and manufacturing cost is also increased.

Further, when the electronic part is mounted, while the vacuum in the vacuum hole 91 is released through the release line 72, an overshoot phenomenon due to the vacuum pressure generated from the vacuum hole 91 and mis-mounting of the electronic part on the PCB due to the remaining pressure may occur.

SUMMARY

Exemplary embodiments provide a vacuum nozzle control apparatus and a head assembly for a chip mounter having the same that are capable of controlling formation of a vacuum used in a nozzle module using a single valve in order to suction an electronic part or release the vacuum in the suctioned state, removing overshoot and a residual pressure due to a vacuum release pressure generated when the vacuum is released after an electronic part is suctioned by a suction hole of a nozzle module, thereby stably mounting the electronic part on a printed circuit board.

In exemplary embodiments, a vacuum nozzle control apparatus is provided.

According to an exemplary embodiment, the vacuum nozzle control apparatus may include a nozzle module having a vacuum hole; a vacuum providing module configured to provide a vacuum to the vacuum hole through a vacuum line; and a vacuum control module configured to selectively form the vacuum in the vacuum hole through the vacuum line, or release the vacuum formed in the vacuum hole through a release line branched off from the vacuum line to expose the vacuum hole to air.

The vacuum line may be formed in a vacuum pipe configured to connect the vacuum hole and the vacuum providing module, and the release line may be formed in a release pipe branched off from a certain position of the vacuum pipe.

The vacuum control module may include a three-way valve installed at a branch-off point between the vacuum line and the release line; and a controller electrically connected to the vacuum providing module and the three-way valve, and configured to receive an electrical signal from an exterior to open the vacuum line to connect the vacuum providing module with the vacuum hole or connect the vacuum line near the vacuum hole with the release line.

Further, a flow regulator may be installed on the vacuum line at a position between the vacuum providing module and the three-way valve to be electrically connected to the controller to control a flow rate of air flowing through the vacuum line.

The controller may set a reference flow rate which increases depending on a size of the vacuum hole, and the controller may control the flow regulator until a flow rate arrives at the reference flow rate corresponding to the size of the vacuum hole.

Further, a chamber may be installed on the vacuum line at a position between the flow regulator and the vacuum providing module, and may be filled with a vacuum pressure corresponding to the reference flow rate adjusted by the flow regulator.

In addition, a first filter may be installed on the vacuum line to filter foreign substances.

Further, a relief module may be installed on the vacuum line.

The relief module may include a module body having a multi-stage shape aperture configured to expose an opening formed at a certain position of the vacuum line to the exterior of the vacuum line; and a relief plate disposed at the aperture to open and close the opening depending on existence of the vacuum in the vacuum line. The aperture may include a first aperture having a first inner diameter and connected to the opening, and a second aperture having a second inner diameter smaller than the first inner diameter. The relief plate may be disposed in the first aperture.

Further, a second filter may be installed in the second aperture to filter foreign substances.

In addition, the vacuum line and the release line may be disposed in the nozzle module.

Other exemplary embodiments are directed to a head assembly for a chip mounter having a vacuum nozzle control apparatus.

According to an exemplary embodiment, the head assembly for a chip mounter includes a nozzle module having a vacuum hole configured to suction an electronic part; a conveyance module connected to the nozzle module and configured to receive an electrical signal from an exterior to convey the nozzle module to a certain position; a vacuum providing module configured to provide a vacuum to the vacuum hole through a vacuum line; and a vacuum control module electrically connected to the conveyance module, and configured to selectively form the vacuum for suctioning the electronic part in the vacuum hole through the vacuum line if the nozzle module is conveyed to a feeder position or release the vacuum formed in the vacuum hole through a release line branched off from the vacuum line to expose the vacuum hole to air to separate the electronic part from the vacuum hole when the nozzle module is conveyed to a PCB position. Here, the feeder position may be a position at which the electronic part supplied from an external source is picked up by the nozzle module, and the PCB position may be a position at which the electronic part suctioned by the nozzle module is mounted on a PCB.

The vacuum line may be formed in a vacuum pipe configured to connect the vacuum hole and the vacuum providing module, and the release line may be formed in a release pipe branched off from a certain position of the vacuum pipe.

The vacuum control module may include a three-way valve installed at a branch-off point between the vacuum line and the release line; and a controller electrically connected to the vacuum providing module and the three-way valve, and configured to open the vacuum line to connect the vacuum providing module with the vacuum hole if position information of the nozzle module transmitted from the conveyance module is equal to position information of a preset feeder position and connect the vacuum line near the vacuum hole with the release line if position information of the nozzle module transmitted from the conveyance module is equal to position information of a preset PCB position.

Further, a flow regulator may be installed on the vacuum line at a position between the vacuum providing module and the three-way valve to be electrically connected to the controller to control a flow rate of air flowing through the vacuum line.

Here, the controller may set a reference flow rate which increases depending on a size of the vacuum hole, and the controller may control the flow regulator until a flow rate arrives at the reference flow rate corresponding to the size of the vacuum hole.

Further, a chamber may be installed on the vacuum line at a position between the flow regulator and the vacuum providing module, and may be filled with a vacuum pressure corresponding to the reference flow rate adjusted by the flow regulator.

In addition, a first filter may be installed on the vacuum line to filter foreign substances.

Further, a relief module may be installed on the vacuum line.

The relief module may include a module body having a multi-stage shape aperture configured to expose an opening formed at a certain position of the vacuum line to the exterior of the vacuum line; and a relief plate disposed at the aperture to open and close the opening depending on existence of the vacuum in the vacuum line. The aperture may include a first aperture having a first inner diameter and connected to the opening, and a second aperture having a second inner diameter smaller than the first inner diameter. The relief plate may be disposed in the first aperture.

Further, a second filter may be further installed in the second aperture to filter foreign substances.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF EXEMPLARY EMBODIMENTS

Figure 1:
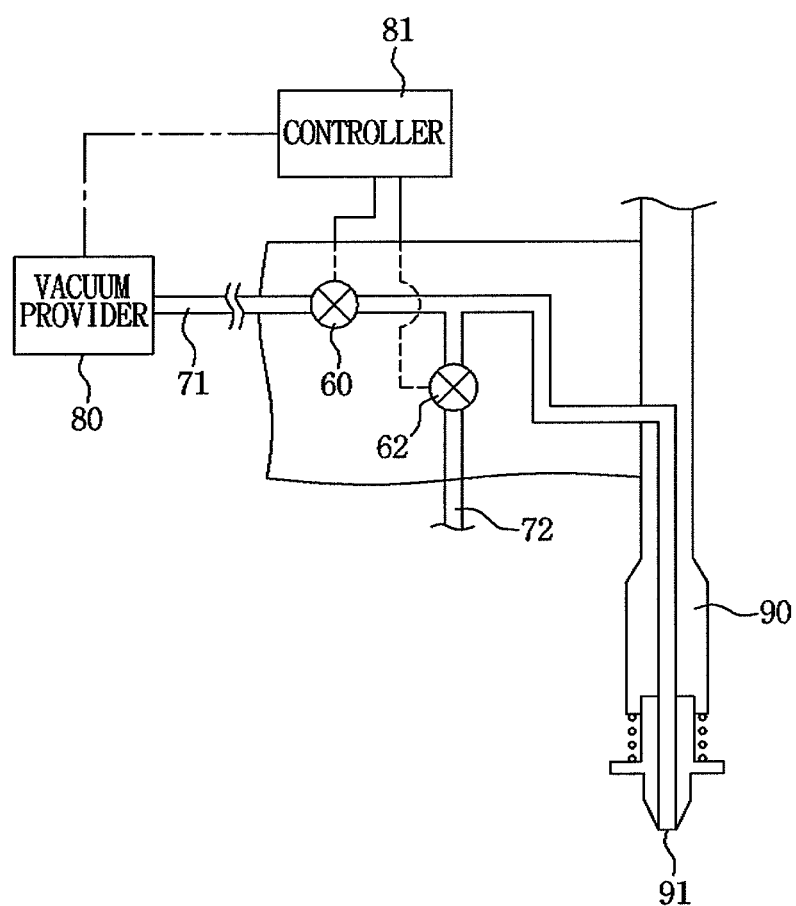
FIG. 1 illustrates a cross-sectional view of a head assembly for a chip mounter configured to form and release a vacuum.

Various exemplary embodiments will now be described more fully with reference to the accompanying drawings. In the drawings, the thicknesses of layers and regions may be exaggerated for clarity.

However, specific structural and functional details disclosed in the exemplary embodiments are merely representative for purposes of describing the exemplary embodiments. The present inventive concept, however, may be embodied in many alternate forms and should not be construed as limited to only the exemplary embodiments set forth herein.

Accordingly, the exemplary embodiments are capable of various modifications and alternative forms. It should be understood, however, that there is no intent to limit the exemplary embodiments to the particular forms disclosed, but on the contrary, the exemplary embodiments are to cover all modifications, equivalents, and alternatives falling within the scope of the present inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and may not be intended to be limiting other exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that spatially relative terms are intended to encompass different orientations of a device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, the exemplary embodiments should not be construed as being limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe the exemplary embodiments, various aspects will be described in detail with reference to the attached drawings. However, the present inventive concept is not limited to those exemplary embodiments as described.

Figure 2:
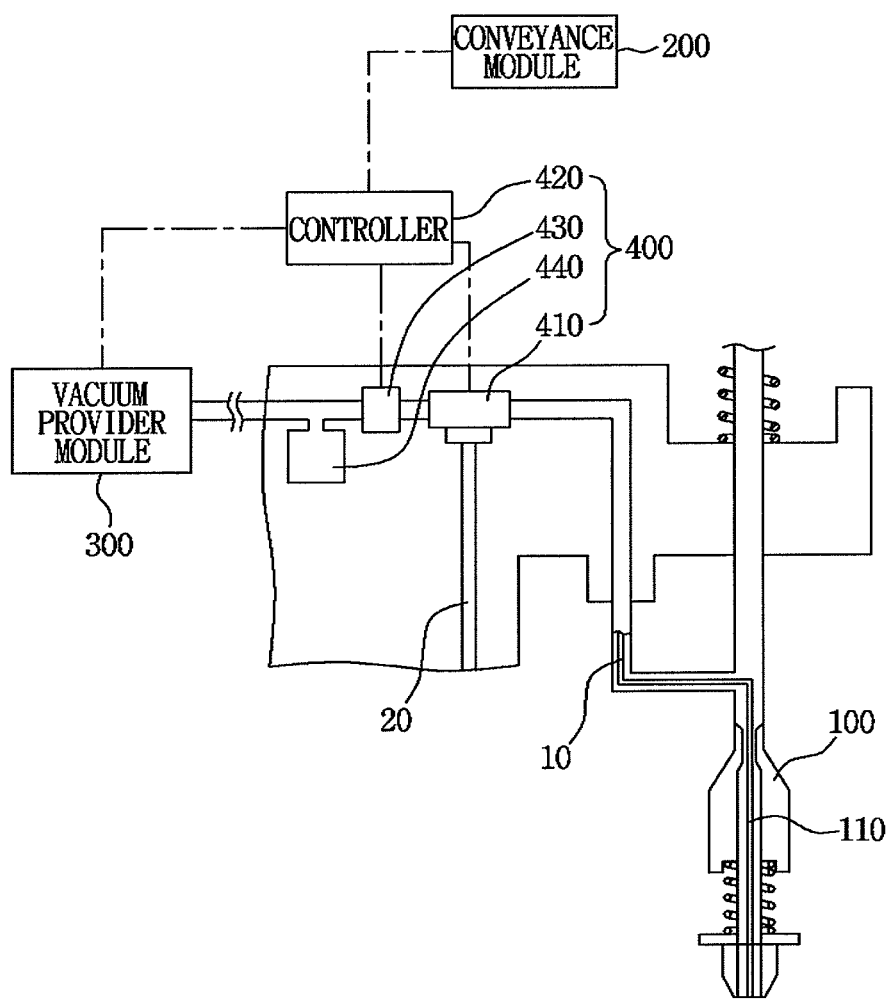
FIG. 2 illustrates a cross-sectional view of a head assembly of a chip mounter in accordance with an exemplary embodiment.
Figure 3:
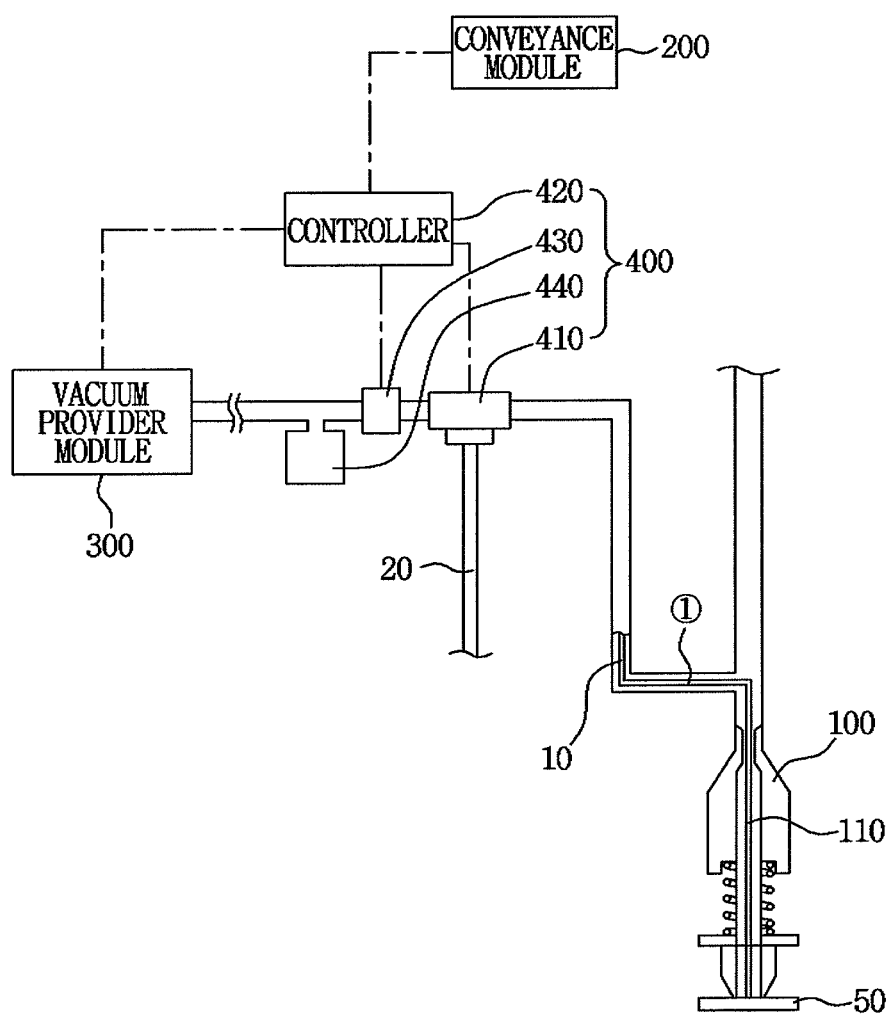
FIG. 3 illustrates a cross-sectional view showing a state in which the vacuum nozzle control apparatus of FIG. 2 suctions an electronic part at a feeder position.
Figure 4:
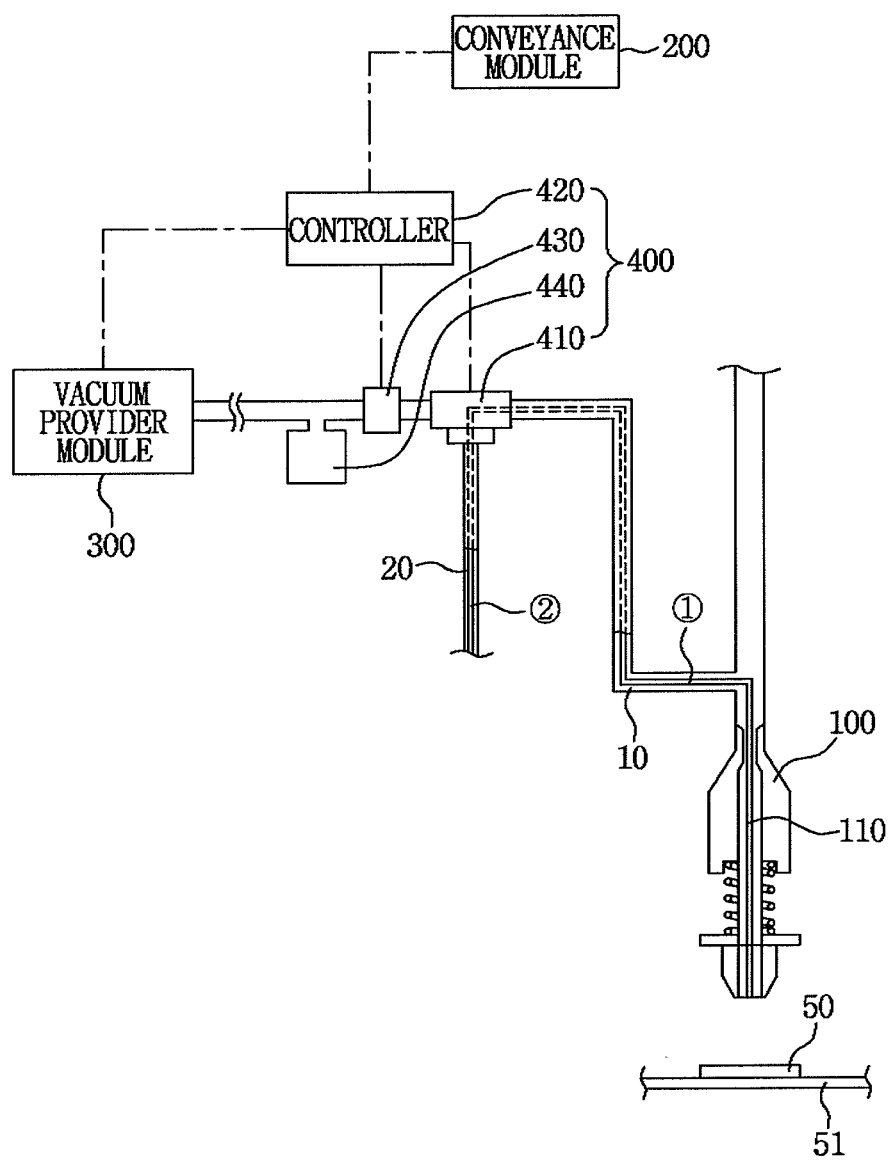
FIG. 4 illustrates a cross-sectional view showing a state in which the vacuum nozzle control apparatus of FIG. 3 mounts the electronic part at a PCB position on a PCB.

FIG. 2 illustrates a cross-sectional view of a head assembly of a chip mounter in accordance with an exemplary embodiment, FIG. 3 illustrates a cross-sectional view showing a state in which the vacuum nozzle control apparatus of FIG. 2 suctions an electronic part at a feeder position, and FIG. 4 illustrates a cross-sectional view showing a state in which the vacuum nozzle control apparatus of FIG. 3 mounts the electronic part at a PCB position on a PCB.

In FIG. 2, a head assembly for a chip mounter is installed on a main body (not shown) of the chip mounter, and includes a vacuum nozzle control apparatus and a conveyance module.

Referring to FIG. 2, the vacuum nozzle control apparatus includes a nozzle module 100, a vacuum providing module 300, and a vacuum control module 400. FIG. 2 also illustrates a conveyance module 200.

A vacuum hole 110 is formed at an end of the nozzle module 100 to suction an electronic part 50.

The vacuum providing module 300 is connected to the vacuum hole 110 through a vacuum line 10. The vacuum line 10 may be a vacuum pipe.

The conveyance module 200 is an apparatus for conveying the nozzle module 100 to a certain position. For example, the conveyance module 200 may be X and Y gantries configured to convey the nozzle module 100 to a certain position on the main body of the chip mounter in X and Y directions, and an actuator may be installed at one of the X and Y gantries to raise and lower the nozzle module 100.

The conveyance module 200 is operated by receiving an electrical signal from a controller 420, which will be described later. The conveyance module 200 may transmit X and Y position information values of the conveyed nozzle module 100 to the controller 420. For example, while not shown, motors of the X and Y gantries have encoders, respectively. Each of the encoders generates an electrical signal according to movement of the nozzle module 100 which is transmitted to the controller 420, and the controller 420 may calculate moving position information values of the nozzle module 100 using the electrical signal.

The vacuum control module 400 is electrically connected to the conveyance module 200. The vacuum control module 400 may form a vacuum for suctioning the electronic part 50 to the vacuum hole 110 through the vacuum line 10 when the nozzle module 100 is conveyed to a feeder position (part suction position) as shown in FIG. 3, and selectively release the vacuum formed in the vacuum hole 110 through a release line 20 branched off from the vacuum line 10 in order to separate the electronic part 50 from the vacuum hole 110 when the nozzle module 100 is conveyed to a PCB position (part mounting position) as shown in FIG. 4. The release line 20 is formed in a release pipe branched off from a certain position of a vacuum pipe in which the vacuum line 10 is formed.

The feeder position may be a position provided at the main body and at which the electronic part 50 supplied from an external part supply apparatus is picked up by the nozzle module 100. The PCB position may be a position at which the electronic part 50 suctioned and conveyed by the nozzle module 100 is mounted on a certain position of a PCB 51. Therefore, a vacuum may be formed in the vacuum hole 110 at the feeder position, and the vacuum formed in the vacuum hole 110 may be released at the PCB position.

Constitution of the vacuum control module 400 will be described in detail with reference to FIGS. 2 to 4.

The vacuum control module 400 includes a three-way solenoid valve 410 installed at a branch-off point between the vacuum line 10 and the release line 20. The vacuum control module 400 also includes a controller 420 electrically connected to the vacuum providing module 300 and the three-way solenoid valve 410. The vacuum control module 400 is configured to open the vacuum line 10 to connect the vacuum providing module 300 with the vacuum hole 110 when position information of the nozzle module 100 transmitted from the conveyance module 200 is equal to that of a preset feeder position, and connect the vacuum line 10 near the vacuum hole 110 with the release line 20 when position information of the nozzle module 100 transmitted from the conveyance module 200 is equal to that of a preset PCB position.

Meanwhile, a flow regulator 430 may be further installed on the vacuum line 10 at a position between the vacuum providing module 300 and the three-way solenoid valve 410. The flow regulator 430 is electrically connected to the controller 420 to control flow a rate of air flowing through the vacuum line 10.

In this case, the controller 420 may set a reference flow rate that proportionally increases depending on the size of the vacuum hole 110. Furthermore, the controller 420 may control the flow regulator 430 until the flow rate arrives at the reference flow rate corresponding to the size of the vacuum hole 110.

In addition, a chamber 440 may be further installed on the vacuum line 10 at a position between the flow regulator 430 and the vacuum providing module 300. The chamber 440 is filled with a vacuum pressure corresponding to the reference flow rate regulated by the flow regulator 430.

Hereinafter, operations of the head assembly for a chip mounter including the vacuum nozzle control apparatus constituted as described above will be described.

Referring to FIGS. 3 and 4, the conveyance module 200 conveys the nozzle module 100 to the feeder position as the part suction position. At this time, the conveyance module 200 transmits position information of the nozzle module 100 moving during conveyance of the nozzle module 100 to the controller 420 as an electrical signal in real time.

The controller 420 determines whether the transmitted position information is equal to that of a preset feeder position.

When the nozzle module 100 is conveyed to the feeder position by the conveyance module 200, the controller 420 forms a vacuum in the vacuum hole 110 of the nozzle module 100 using the nozzle module 100 to suction the electronic part 50 awaiting at the feeder position.

That is, the controller 420 operates the three-way solenoid valve 410 to open the vacuum line 10 configured to connect the vacuum providing module 300 to the vacuum hole 110. At this time, the release line 20 is closed by operation of the three-way solenoid valve 410. The three-way solenoid valve 410 is a valve configured to receive an electrical signal from the controller 420 to open the vacuum line 10 connecting the vacuum providing module 300 to the vacuum hole 110, or connect the vacuum line 10 near the vacuum hole 110 with the release line 20.

After the three-way solenoid valve 410 opens the vacuum line 10, the controller 420 transmits an electrical signal to the vacuum providing module 300 so that the vacuum providing module 300 forms a certain level of vacuum in the vacuum line 10.

As a result, the certain level of vacuum is formed in the vacuum hole 110 provided at an end of the nozzle module 100, and the electronic part awaiting at the feeder position may be suctioned to an end of a nozzle by the vacuum formed in the vacuum hole 110.

Then, referring to FIG. 4, the controller 420 conveys the nozzle module 100, to which the electronic part 50 is suctioned, along a conveyance path to the PCB position using the conveyance module 200. At this time, the conveyance module 200 transmits position information varied depending on conveyance of the nozzle module 100 to the controller 420 in real time. The position information of the PCB position is preset in the controller 420.

The controller 420 determines whether position information transmitted from the conveyance module 200 is equal to that of preset PCB position information.

As a result, when the nozzle module 100 is conveyed to the PCB position by the conveyance module 200, the controller 420 releases the vacuum formed in the vacuum hole 110 in order to mount the electronic part 50 suctioned by the nozzle module 100 on the PCB 51.

That is, the controller 420 stops operation of the vacuum providing module 300 and operates the three-way solenoid valve 410 to connect the vacuum line 10 near the vacuum hole 110 with the release line 20 branched off from the vacuum line 10. This may be referred to as a vacuum release path ②. In addition, by means of the operation of the three-way solenoid valve 410, an opened vacuum forming path ① may be closed.

Therefore, the vacuum formed in the vacuum hole 110 may be readily released through the vacuum release path ② to prevent generation of a vacuum release pressure when the vacuum is released. In addition, the electronic part 50 suctioned to an end of the nozzle module 100 may be stably separated from the end of the nozzle module 100 due to the vacuum release without overshoot and a residual pressure in the vacuum hole 110, and mounted on a certain position of the PCB 51.

As a result, by performing formation and release of the vacuum in the vacuum hole 110, when the vacuum is released after a predetermined time from suction of the electronic part into the vacuum hole 110 of the nozzle module 100, generation of the vacuum release pressure can be effectively prevented, and thus, overshoot and a residual pressure due to the vacuum release pressure can be removed to stably mount the electronic part on the PCB 51.

Meanwhile, the flow regulator 430, which may be further installed at the vacuum line 10, may receive an electrical signal from the controller 420 to regulate an air flow rate through the vacuum line 10.

In this case, the controller 420 may set a reference flow rate that proportionally increases depending on the size of the vacuum hole 110, and the controller 420 may control the flow regulator 430 until the flow rate arrives at the reference flow rate corresponding to the size of the vacuum hole 110.

Further, a vacuum pressure corresponding to the reference flow rate regulated by the flow regulator 430 may be filled in the chamber 440, which may be further installed on the vacuum line 10 at a position between the flow regulator 430 and the vacuum providing module 300.

That is, when the nozzle module 100 comprises a plurality of nozzles having vacuum holes 110 with different diameters, different magnitudes of vacuum pressures may be provided to the nozzles. Therefore, the controller 420 may control the flow regulator 430 installed at each nozzle of the nozzle module 100 to the reference flow rate, and thus, corresponding vacuum pressures may be filled in the chambers 440 installed at the nozzles of the nozzle module 100.

As a result, the controller 420 may control the flow regulator such that different vacuum pressure can be formed in the plurality of nozzles.

Figure 5:
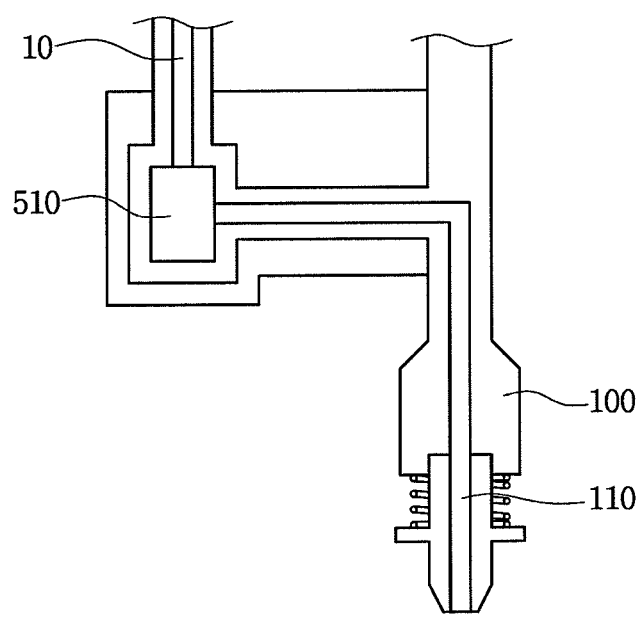
FIG. 5 illustrates a cross-sectional view showing a first filter installed in a vacuum line of FIG. 2.

Meanwhile, FIG. 5 shows a first filter 510 installed in the vacuum line 10 of FIG. 2.

Here, the first filter 510 may prevent introduction of foreign substances into the vacuum line 10 from the exterior of the nozzle module 100 when the vacuum forming path ① is opened to form a vacuum in the vacuum hole 110.

Figure 6:
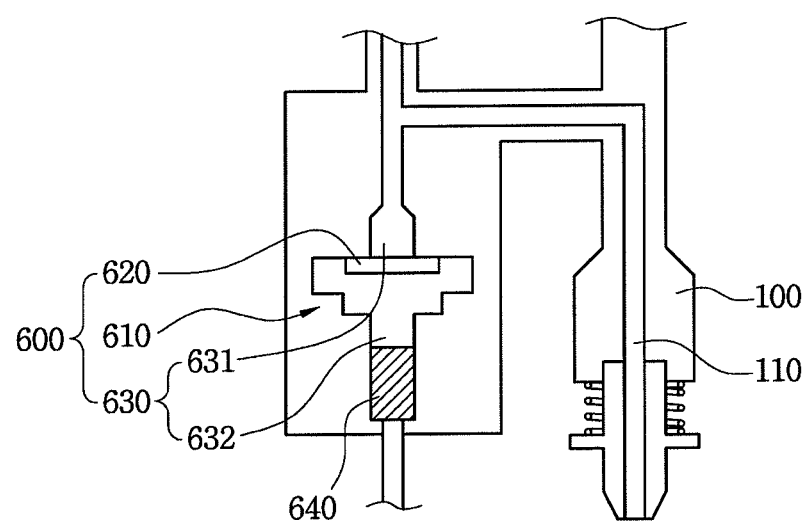
FIG. 6 illustrates a cross-sectional view showing a relief module installed in the vacuum line of FIG. 2.

FIG. 6 shows a relief module 600 further installed in the vacuum line 10 of FIG. 2.

The relief module 600 is connected to an opening 11 (shown in FIG. 7) formed at a certain position of the vacuum line 10, and includes a module body 610 having a multi-stage shape aperture 630 configured to expose the module body 610 to the exterior of the vacuum line 10, and a relief plate 620 disposed in a first aperture 631 of the aperture 630 to open and close the first aperture 631 depending on formation of the vacuum in the vacuum line 10.

That is, the aperture 630 is constituted by the first aperture 631 having a first inner diameter and connected to the opening 11, and a second aperture 632 connected to the first aperture 631 and having a second inner diameter smaller than the first inner diameter, the relief plate 620 being disposed in the first aperture 631.

In addition, a second filter 640 is further installed in the second aperture 632 to filter foreign substances.

When the vacuum forming path ① is opened to form a vacuum in the vacuum hole 110, a certain level of vacuum is formed in the vacuum line 10.

As a result, the relief plate 620 disposed in the first aperture 631 of the module body 610 in communication with the opening 11 of the vacuum line 10 is raised to close the opening 11. Therefore, a vacuum pressure is stably formed in the vacuum line 10.

Further, when the vacuum release line ② is opened, the vacuum line 10 near the vacuum hole 110 and the release line 20 may have an atmospheric pressure or more. Thus, the relief plate 620 adhered to the opening 11 is moved downward from the interior of the first aperture 631 to open the first and second apertures 631 and 632 to the air.

As a result, as movement of the relief plate 620 opens the vacuum line 10 to the air, the electronic part 50 may be stably separated from the vacuum hole 110, and thus, the electronic part 50 may be stably mounted on the PCB 51.

In this process, it is possible to prevent introduction of foreign substances into the aperture 630 of the module body 610 from the exterior using the second filter 640.

Figure 7:
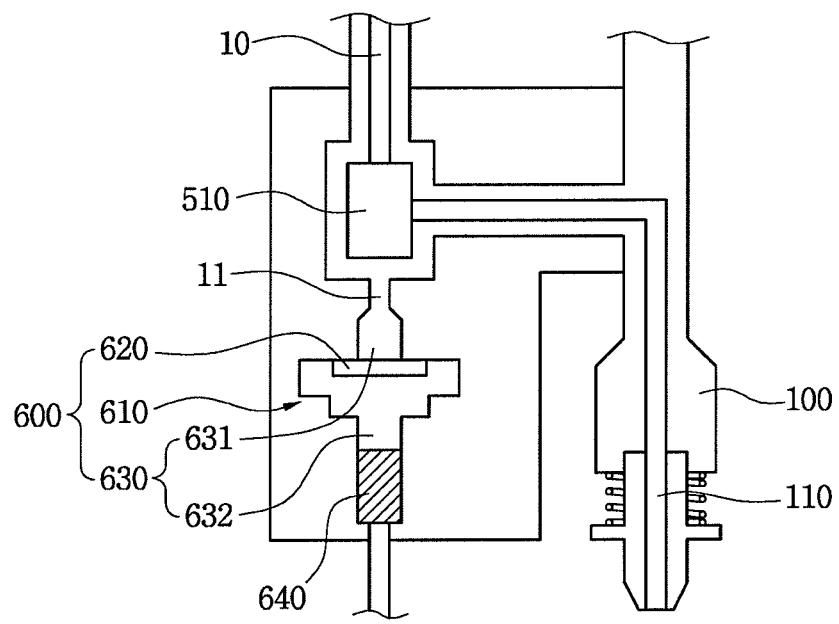
FIG. 7 illustrates a cross-sectional view showing both the first filter and the relief module installed in the vacuum line of FIG. 2.

FIG. 7 shows both the first filter 510 and the relief module 600 installed in the vacuum line of FIG. 2.

Figure 8:
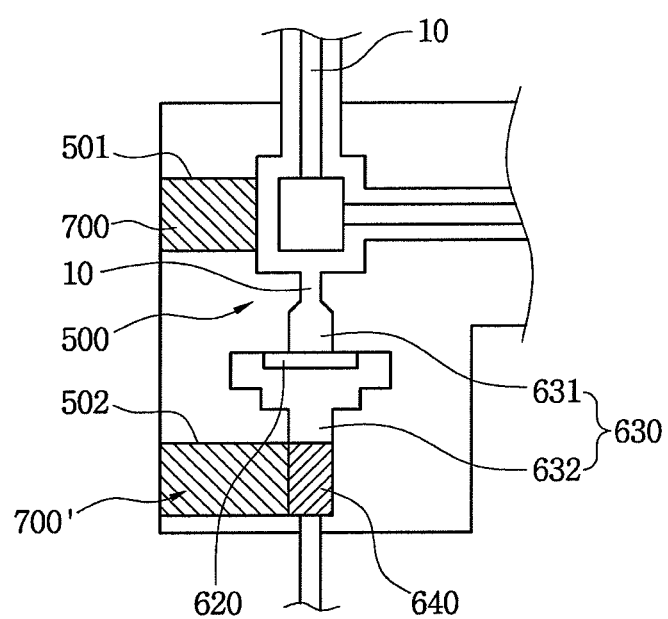
FIG. 8 illustrates a cross-sectional view of a cover configured to expose the first and second filters of FIG. 7 to an exterior.

Referring to FIG. 8, the first filter 510 is installed in a filter case 500. The filter case 500 has a flow path 501 in communication with the vacuum line, and a cover 700 is installed in the flow path 501 to cover the first filter 510.

In addition, the filter case 500 is connected to the relief module 600. The filter case 500 has an inner flow path 502 which is in communication with the aperture 630 of the module body 610. In addition, the aperture 630 is constituted by the first and second apertures 631 and 632, which are exposed to the air, and the relief plate 620 is installed at the first aperture 631. Further, a cover 700' is installed in the flow path 502.

Therefore, the first filter 510 and the second filter 640 may be exposed to the exterior.

That is, the cover 700 as a first window formed of a transparent material may be installed at the filter case 500, in which the first filter 510 is installed so that the first filter 510 can be observed from the exterior.

Further, in the relief module 600, another cover 700' as a second window formed of a transparent material may be installed at the module body 610 so that the second filter 640 installed at the first opening formed therein can be observed from the exterior.

Therefore, the first filter 510 and the second filter 520 configured to filter foreign substances may be visually observed through the covers 700 and 700', and an amount of the foreign substances accumulated in the first and second filters 700 and 700' may also be readily observed.

Furthermore, if both the first filter 510 and the relief module 600 are installed on the vacuum line 10, when the vacuum forming path ① is opened, it is possible to prevent introduction of foreign substances into the vacuum line 10 using the first filter 510, and when the vacuum release path ② is opened, the electronic part 50 may be stably dropped from the vacuum hole 110 by the relief module 600. Since other constitutions and operations are substantially the same as described above, detailed description thereof will not be repeated.

While not shown, the first filter 510 and the relief module 600 may be detached from the vacuum line 10.

That is, the first filter 510 includes a filter case coupled to the vacuum line 10, and is installed in a flow path in the filter case. In other words, both ends of the filter case may be coupled to the vacuum line 10, and the vacuum forming path ① may pass through the first filter 510. Here, the filter case may be threadedly engaged with the vacuum line 10.

The module body 610 may be coupled to the filter case. At this time, the aperture 630 formed in the module body 610 is coupled to be in communication with an opening of the filter case. Here, the module body 610 may be threadedly engaged with the filter case.

Therefore, the first filter 510 or the relief module 600 may be readily detached from the vacuum line 10 to be exchanged with another filter or another module.

As can be seen from the foregoing, in order to suction an electronic part or release the suction state, formation of a vacuum used in a nozzle module can be controlled using a single valve, and overshoot and a residual pressure due to a vacuum release pressure generated when the vacuum is released after an electronic part is suctioned by a suction hole of a nozzle module can be removed to thereby stably mount the electronic part on a printed circuit board.

In addition, in order to suction an electronic part or release the suction state, formation of a vacuum used in a nozzle module can be controlled using a single valve, and thus, excessive equipment cost due to use of a plurality of unnecessary valves can be reduced.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other embodiments, are intended to be included within the scope of the appended claims.

What is claimed is:

1. A vacuum nozzle control apparatus comprising:
a nozzle module which comprises a vacuum hole;
a vacuum providing module which is configured to provide a vacuum to the vacuum hole through a vacuum line; and
a vacuum control module which is configured to selectively form the vacuum in the vacuum hole through the vacuum line, and release the vacuum formed in the vacuum hole through a release line directly branched off from the vacuum line to expose the vacuum hole air,
wherein the vacuum control module comprises:
a three-way valve which is installed at a branch-off point between the vacuum line and the release line; and
a controller which is electrically connected to the vacuum providing module and the three-way valve, and is configured to receive a signal from an external source to open the vacuum line to connect the vacuum providing module with the vacuum hole or connect the vacuum line near the vacuum hole with the release line.

2. The vacuum nozzle control apparatus according to claim 1, wherein the vacuum line is formed in a vacuum pipe connecting the vacuum hole and the vacuum providing module, and
wherein the release line is formed in a release pipe branched off from a certain position of the vacuum pipe.

3. The vacuum nozzle control apparatus according to claim 1, further comprising a flow regulator which is installed on the vacuum line at a position between the vacuum providing module and the three-way valve, and is electrically connected to the controller to control a flow rate of air flowing through the vacuum line,
wherein the controller sets a reference flow rate which increases depending on a size of the vacuum hole, and
wherein the controller controls the flow regulator to adjust the flow rate of air to the reference flow rate corresponding to the size of the vacuum hole.

4. The vacuum nozzle control apparatus according to claim 3, further comprising a chamber installed on the vacuum line at a position between the flow regulator and the vacuum providing module, and is filled with a vacuum pressure corresponding to the reference flow rate adjusted by the flow regulator.

5. The vacuum nozzle control apparatus according to claim 1, wherein a filter case is detachably installed on the vacuum line, and a first filter is installed in the filter case to filter foreign substances.

6. The vacuum nozzle control apparatus according to claim 1, further comprising a relief module installed on the vacuum line,
wherein the relief module comprises:
a module body which comprises a multi-stage shape aperture configured to expose an opening formed at a certain position of the vacuum line to an exterior of the vacuum line; and
a relief plate which is disposed at the aperture to open and close the opening depending on an existence of the vacuum in the vacuum line, wherein the aperture comprises:
a first aperture which has a first inner diameter and is connected to the opening; and
a second aperture which has a second inner diameter smaller than the first inner diameter, and
wherein the relief plate is disposed in the first aperture.

7. The vacuum nozzle control apparatus according to claim 6, further comprising a second filter which is installed in the second aperture to filter foreign substances.

* * * * *